United States Patent

[11] 3,631,298

[72] Inventor John S. Davis
Glendale, Calif.

[21] Appl. No. 869,029
[22] Filed Oct. 24, 1969
[45] Patented Dec. 28, 1971

[73] Assignee The Bunker-Ramo Corporation
Oak Brook, Ill.

[54] WOVEN INTERCONNECTION STRUCTURE
11 Claims, 16 Drawing Figs.

[52] U.S. Cl. .......... 317/101 CC, 29/626, 139/425, 174/68.5, 174/117 F, 339/17 C, 339/17 CF
[51] Int. Cl. .......... H05k 1/18
[50] Field of Search .......... 174/68.5, 117.11, 117.2; 139/425; 339/17 C, 17 CF, 17 F; 29/626

[56] References Cited

UNITED STATES PATENTS

| | | | |
|---|---|---|---|
| 3,160,790 | 12/1964 | Mittler .......... | 174/68.5 X |
| 3,371,250 | 2/1968 | Ross et al. .......... | 174/68.5 X |
| 3,447,120 | 5/1969 | Rask et al. .......... | 174/117.2 X |
| 3,479,565 | 11/1969 | Ross et al. .......... | 174/68.5 X |

FOREIGN PATENTS

| | | | |
|---|---|---|---|
| 1,085,207 | 7/1960 | Germany .......... | 174/68.5 |
| 1,082,641 | 6/1960 | Germany .......... | 174/117.2 |
| 1,175,761 | 8/1964 | Germany .......... | 174/68.5 |

*Primary Examiner*—Darrell L. Clay
*Attorney*—Frederick M. Arbuckle

ABSTRACT: A structure for providing circuit interconnections by means of a woven fabric. Special elements and techniques are employed to establish the individual wire-to-terminal or wire-to-wire connections within the structure and also those required for the attachment to external circuit modules. These external circuit modules have perpendicularly depending output terminals and are connected to the woven structure by providing corresponding float wire patterns for each module, the float wires being cut and bent to form aligned mating terminals for receiving the module terminals. In a particular embodiment connection to the external components is accomplished by providing the float wires as hollow tubular members within which the module terminals are respectively inserted.

INVENTOR
JOHN S. DAVIS
BY Fraser and Bogucki
ATTORNEYS

INVENTOR
JOHN S. DAVIS
BY [signature]
ATTORNEYS

INVENTOR
JOHN S. DAVIS
BY Fraser and Bogucki
ATTORNEYS

INVENTOR
JOHN S. DAVIS
BY [signature]
ATTORNEYS

WOVEN INTERCONNECTION STRUCTURE

BACKGROUND OF THE INVENTION

1. Field of the Invention

This invention relates to electrical interconnecting circuitry, and more particularly to a plurality of conductors and insulating filaments interwoven to form a circuit-connecting structure.

2. Description of the Prior Art

In the fabrication of a computer, for example, or any device in which a large number of components or essentially repetitive circuit modules are to be interconnected, the problem of fabrication involves essentially the problem of providing the necessary interconnecting circuit paths between the various components or modules. Various approaches to the solution of this problem have been made and include various types of printed circuit boards, wire-wrapped connections by automatic wiring machine and even automatic weaving of insulating and conducting filaments in a base structure. In an automatic wiring machine, both the circuit paths and the terminal connections to the various components and modules are laid out by machine. However, with the printed circuit boards and the woven circuitry, the problem of connection of the individual circuit paths to the respective terminals of the various components and modules still remains. This has been fairly well solved in the case of printed circuit boards by the use of dip soldering after the various components are placed in position relative to the printed circuit paths. Efforts to solve the problem with respect to the woven circuitry have not as yet been successful in known prior art arrangements, principally because of the individual wires attempted to be connected. Efforts to duplicate the approach as with printed circuit boards have not resulted in uniformly reliable circuit configurations. In this approach, it is apparently too difficult to hold the respective wires and terminals in spatial juxtaposition such that soldering is effective. The same thing appears to be the case with attempts to spot weld the terminals and wires of the woven circuitry together. Accordingly, woven interconnecting circuitry, although inherently offering a number of apparent advantages with respect to fabrication cost, reliability, adaptability to automation, speed of fabrication, and capability of providing interconnecting circuitry for a large number of module terminals with high stack density have not been realized because of the problem just mentioned.

It is therefore a general object of the present invention to provide an improved structural configuration for the automatic interconnection of closely spaced circuit elements.

It is another object of the present invention to provide a woven circuit configuration for the interconnection of closely spaced circuit elements.

It is still another object of the present invention to provide a woven circuit configuration which is suitable for the rapid, automatic and reliable fabrication of mass produced electrical circuits.

SUMMARY OF THE INVENTION

In brief, particular arrangements in accordance with the invention involve the weaving of an exceptionally large matrix, the size of which depends upon the functional element being woven. Fine electrical conductors are interwoven with insulating fibers, preferably Fiberglass or some other insulator having good dielectric properties, into a fabric configuration which provides the desired separation and thereby insulation of the electrical conductors from each other except at the points where desired interconnections are to be made. The weaving is controlled so as to provide suitable electrical conductors at appropriate points in the structure at which the components and modules are to be attached.

In accordance with the invention, such woven matrices may be fabricated with a width of from 40 to 10 feet. Continuous lengths as long as several thousand feet can be woven, depending upon the particular device for which the circuit is being fabricated. For example, for use in a computer, the width may vary from a practical standpoint with the number of bits in the word length. The length of the matrix will depend upon the logic content of a functional element and upon the complexity of the circuit modules which are to be connected into the matrix. Arrangements in accordance with the invention are ideally suited for interconnecting in-line printed circuit modules, commonly known as "flat packs." In accordance with an aspect of the invention, an individual conducting element interwoven in the circuit structure is "shared" by a number of circuit modules. This achieves high circuit density, approximately one flat pack per square inch. The individual wires which are shared among a plurality of flat packs may be severed from one module position to the next; thus the "sharing" does not mean that the connections are made in parallel to all of the circuit modules.

In accordance with a further aspect of the invention, for use with circuit modules having pin-type terminals, certain of the woven conductors may be in the form of hollow tubes. The inside diameter of each tube is slightly larger than the maximum diameter of the module terminal pins. In each section of the woven structure where connections are to be made between the circuit paths and the terminals of a circuit module, the tubes are cut and bent at right angles to the matrix by a special angle tool. In the case of an in-line flat pack, 14 pins are involved and the tool is designed to hold 14 bent tubes in place so that the in-line pack may be inserted. The 14 tubes are then crimped onto the flat pack pins after the pins are inserted therein. A tube, for example, could be a helical spring.

In accordance with an alternative aspect of the invention, the woven circuit configuration may comprise a plurality of wires which are cut and bent in the manner just described for the matrix tubes, and individual connecting tubes in the form of sleeves may be placed in position on the flat pack terminal pins and slipped onto the matrix wires to which they are to be connected. Integrity of the connection is assured by crimping the tubes or sleeves onto the pins and the matrix wires.

In another particular arrangement in accordance with the invention, the flat pack circuit module terminals may be formed to provide a U-shaped or circular cross section. The wires of the woven matrix structure are cut and bent upwards as before and the shaped module terminals are placed thereon and crimped to complete the permanent circuit connection.

Extremely close spacing of the individual circuit wires can be realized by particular arrangements in accordance with the present invention. The present limitations in the manufacture of printed circuit boards and connectors establish a minimum permissible spacing of approximately 0.1 inch on centers. While the use of special techniques may permit slight reductions of spacing in printed circuit boards and connectors, this seems to be a practical limit because of the danger of lifting the leads from the substrate and because of the problem of cracks developing in the individual printed circuit paths. Where wires are employed however, as in the woven circuit arrangements in accordance with the present invention, much finer spacing is possible because of the greater effectiveness of the wire as a conductor as compared with the flat ribbon of a printed circuit board, and because of the insulation actually interwoven between adjacent wires. Moreover, if extremely high density and close spacing is desired, additional layers of fabric may be interwoven together to achieve the effect of a laminated or stacked woven circuit.

In accordance with another aspect of the invention, conducting wires which are interwoven in the circuit are pretinned. In this particular arrangement, the need for crimping the tubes at the various individual connections is eliminated by virtue of the fact that the interconnections in the matrix and the connections from the flat packs to the tubes can be made at one time by a dip solder step, by immersion in a hot fat dip, or by induction heating all at one time for a very brief interval.

One particular advantage which may be realized in circuit variations in accordance with the invention is the control of the parameters of the individual wires. In a woven matrix, the signal wires may be woven in parallel (signal and return) so that the inductance of such wires may be held constant in terms of design characteristics. In effect, such signal lines may be treated as transmission lines with a controlled characteristic impedance.

The repair of breaks in a woven circuit configuration in accordance with the present invention may be easily made by simply cutting the damaged wires and inserting a soldered tube splice. Circuit modules can be removed from the woven matrix with almost the same technique by which they are presently removed from printed circuit boards. Spacing of the individual wires can be easily controlled and changed during fabrication if desired, merely by changing the gears on the loom on which the woven interconnection circuitry is fabricated.

BRIEF DESCRIPTION OF DRAWING

A better understanding of the present invention may be had from a consideration of the following detailed description, taken in conjunction with the accompanying drawing, in which:

As shown in FIG. 1, a particular woven circuit structure 10 in accordance with the invention comprises a frame 12 extending generally about a fabric portion 14 on which a plurality of circuit modules are arrayed. The circuit modules 16 may be in the form of so-called flat packs. Such integrated circuit modules may comprise one or more semiconductor units together with the interconnecting leads and associated circuit components required to make up a particular module. These modules are available in various pack dimensions and configurations, but a typical IC module may be one-quarter inch by one-quarter inch, not including the space occupied by the leads extending from the package. Other units known as dual-in-line packs are oblong in shape, being somewhat longer than one-quarter inch in the greater dimension, and such units when fashioned in the dual-in-line module typically have seven leads extending from each of the two long sides in opposed juxtaposition. Arranging such circuit modules in the woven circuit configuration as shown in FIG. 10 typically results in a density of approximately one module per square inch of circuit.

Figure 2:
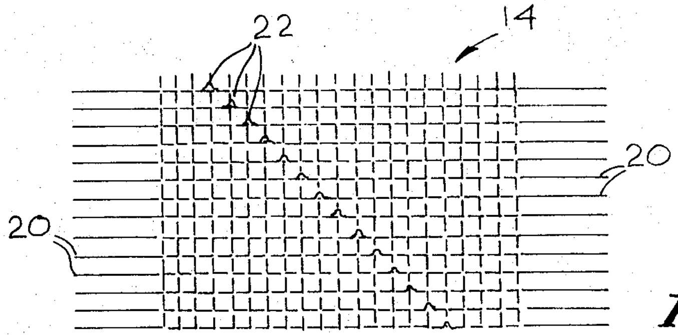
FIG. 2 is an enlarged view of a portion of the arrangement shown in FIG. 1.

As better shown in the enlarged view of FIG. 2, woven circuit fabrics in accordance with the invention, such as 14, comprise a plurality of warp and shoot conductors interwoven with fibers of suitable insulating material also extending in orthogonal directions. A typical material employed for the insulating fibers is glass. It is not essential that the respective filaments, both insulating and conducting, extend orthogonally to each other. They may be woven in any manner and with any juxtaposition which develops substantial crossovers between conductors of one set and conductors of another set. This permits the weave pattern to be developed so that selected conductors of the two sets can be brought into contact with each other as desired to develop the conductor interconnections. The interwoven insulating fibers are so fabricated with the respective conducting filaments as to provide insulation and/or isolation between adjacent conductors except at the points where crossover interconnections are intended.

In view of FIG. 2, which is an enlarged portion of woven fabric 14, sections are shown on both the right-hand and left-hand sides of the figure in which horizontally extending conductors 20 are "floated" to lie on top of the interwoven fabric. In the central portion of FIG. 2, the shoot or fill conductors 20 are interwoven in the fabric which also contains the warp conductors that are lifted over the shoot conductors 20 at nodal points such as 22 to provide contact between particular pairs of warp and shoot conductors, thus establishing electrical connection at the respective nodal points 22.

Figure 3:
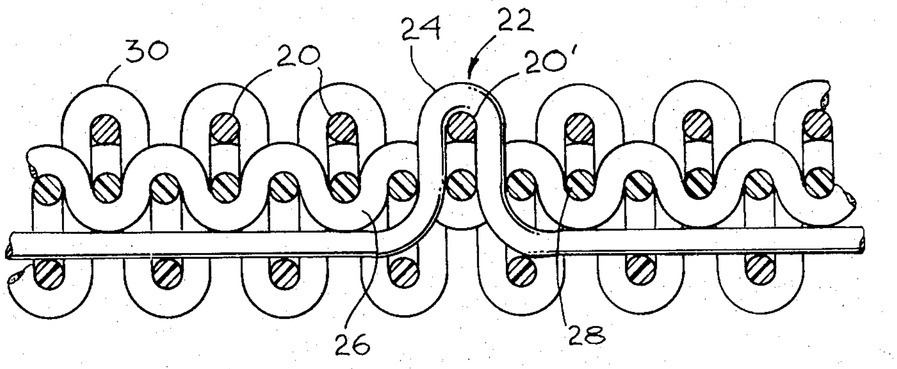
FIG. 3 is a cross-sectional diagram illustrating the manner of interconnection of conductors in arrangements in accordance with the invention.

This is better shown in the schematic section diagram of FIG. 3, which is looking end on at filaments 20 extending in the fill direction and shows a warp conductor 24 extending upwardly from its normal plane to pass around a fill conductor 20' at a nodal point 22 to establish a desired electrical connection between the two conductors 24 and 20' at that point. It will be noted that a suitable spacing is maintained between the fill conductors and the plane of the warp conductors with both warp and fill insulating fibers 26 and 28 respectively interwoven between the two planes to maintain the desired insulation therebetween. Similar spacing and separation is provided between adjacent pairs of fill wires and also between adjacent pairs of warp conductors. The entire fabric is tied together by fill binder insulating fibers such as 30.

Figure 4:
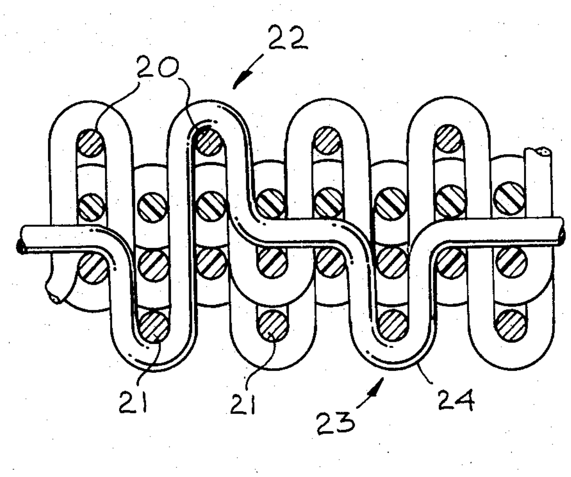
FIG. 4 is another cross-sectional diagram illustrating a woven circuit arrangement in accordance with the invention having a multiplicity of layers of conductors woven within the fabric.

A similar woven circuit pattern is depicted in FIG. 4, differing from FIG. 3 in that a multiple layer arrangement having a plurality of layers of the fill conductors 20 and 21 is provided. Individual warp conductors 24 are taken out of the warp conductor plane in either direction to establish nodal connection points such as 22 and 23 at selected upper and lower fill conductors 20 and 21 respectively. Additional layers of conductors and associated insulating fibers may be woven in a single direction in a unitary fabric as needed to accommodate the desired density of associated circuit modules or other components. In one particular application of the multilayer circuit configuration represented in FIG. 4, one of the fill conductor planes may comprise an interwoven ground plane to which connections from the warp conductor plane may be established or omitted as desired. Such an arrangement may provide improved shielding, for example, in particular applications.

Figure 5:
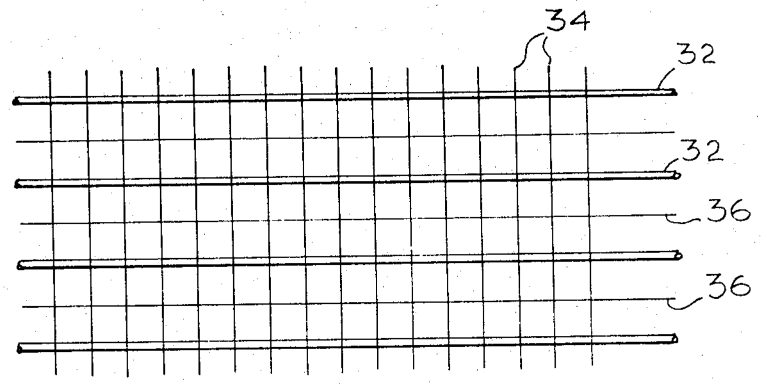
FIG. 5 is a schematic representation of an arrangement of woven conductors in accordance with the invention.

The details of a particular woven circuit configuration are represented schematically in FIG. 5 in which the insulating filler fibers have been omitted for better clarity. As shown in FIG. 5, a plurality of small hollow tubes 32 are shown running in the fill direction, interwoven with solid conducting wires 34 extending in the warp direction. Additional fill wires 36 are interspersed between adjacent tubes 32. In the manner indicated in FIG. 3, a connection can be established between any warp conductor 34 and fill conductor, either a wire 36 or a tube 32, by establishing a nodal point where the selected conductors cross. Thus, a connection can be established between any pair of conductors extending in the fill direction or extending in the warp direction by developing two suitably placed nodal points which serve to connect the two selected conductors to a single conductor extending in the orthogonal direction. The tubes 32 are provided to permit ready connection to associated circuit components having external pins. The respective solid wires 36 are interspersed between the tubes for providing additional facility in circuit connections. The solid wires 34 and 36 are of copper and may vary from 0.001 to 0.050 inch in diameter. The warp and fill conductors are typically spaced 0.1 inch on centers. The inside diameter of the tubes 32 is chosen to fit the outside diameter of the component leads to which connection is to be established.

Figure 6:
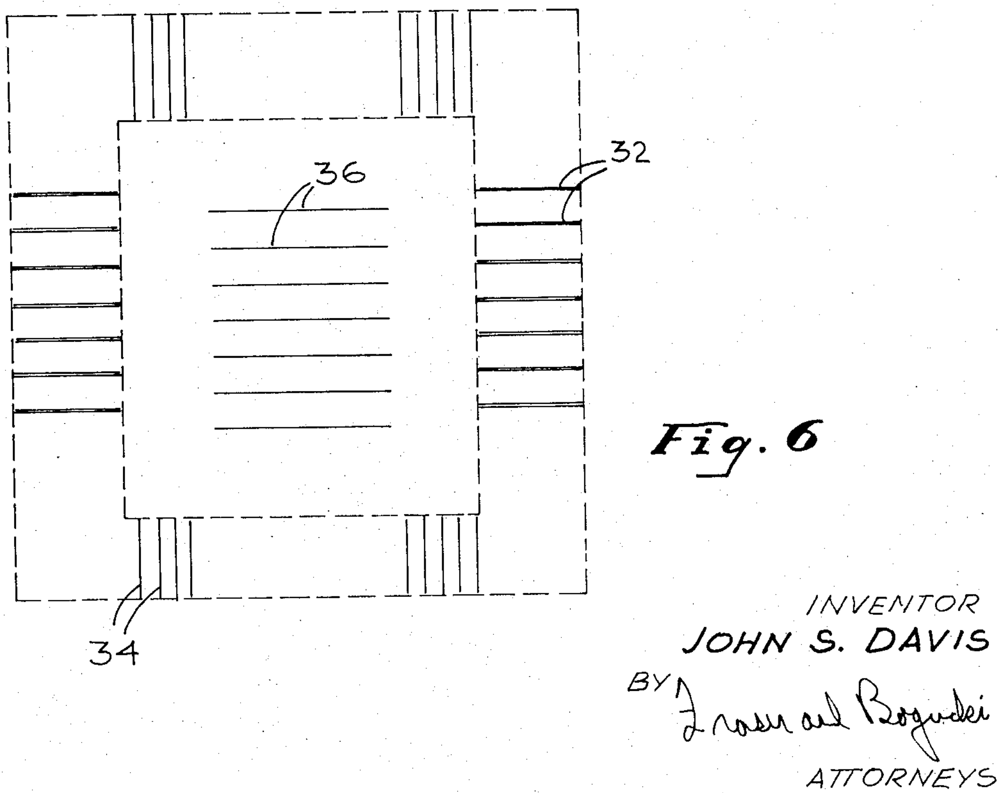
FIG. 6 is a diagram of an enlarged portion of FIG. 1 showing the juxtaposition of conductors arranged in particular cutting areas.

FIG. 6 shows a typical "float" pattern in the vicinity of a single circuit module. FIG. 6 represents an enlarged pattern corresponding to that shown in FIG. 5. Floated fill wires 36 in the central region of FIG. 6 are cut prior to module insertion. Selected warp wires 34 are floated in the periphery of the module to permit cutting as desired. The two tubes 32 are floated also along the periphery of the module for cutting in that region. The respective connecting wires 34 and 36 are cut and interconnected with each other and with tubes 32 on a selective basis to develop the desired external connections from one circuit module to the next without establishing short circuits along wires which are not to be repeated from one module to the next.

Figures 7, 8, 9, 10, 11:
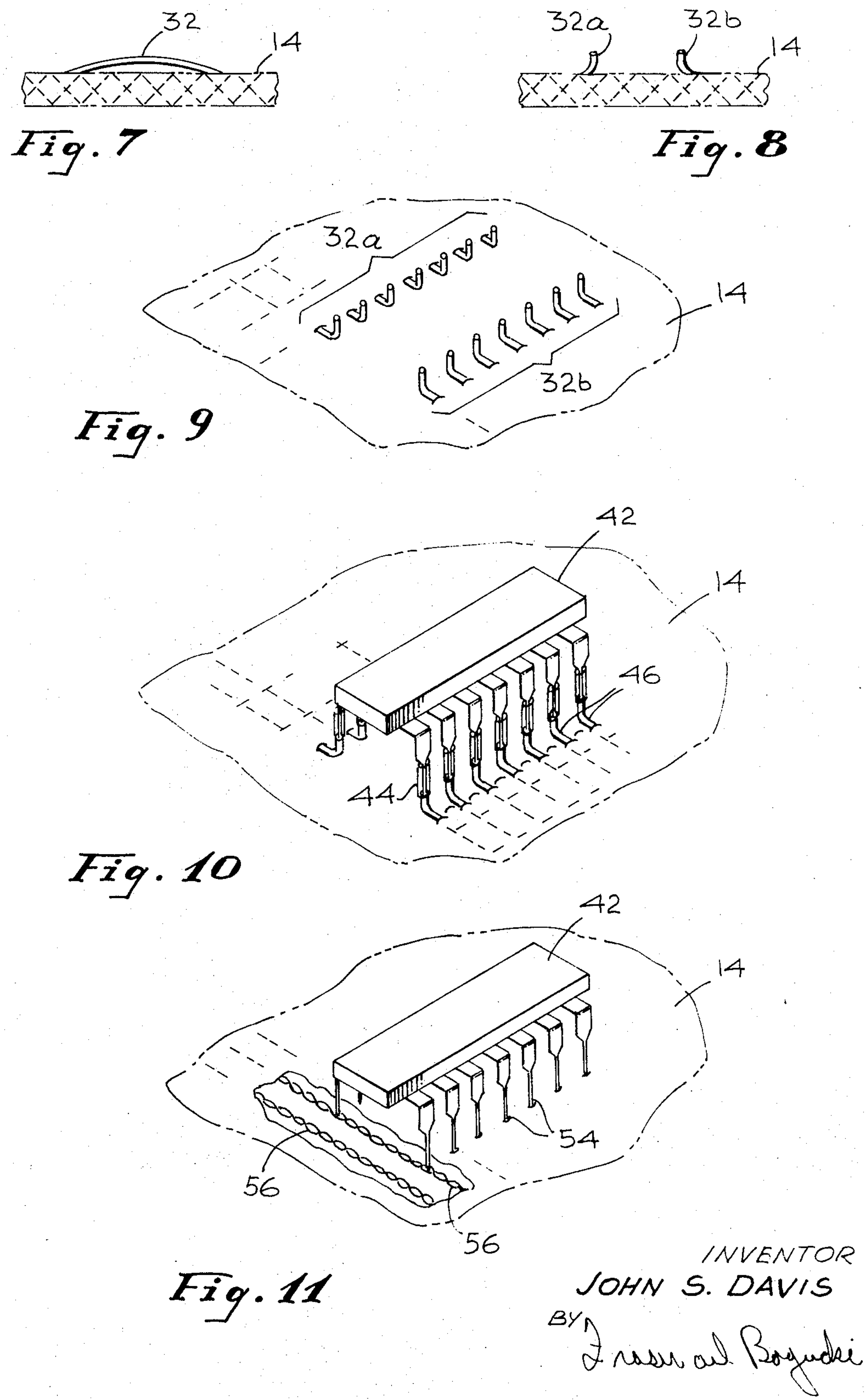
FIG. 7 is a diagram showing a portion of the arrangement of FIG. 6 prior to severance of the conductor.
FIG. 8 is a diagram of the same portion of FIG. 6 showing the conductor after severance.
FIG. 9 illustrates a portion of the section shown in FIG. 6 with the conducting tubes bent in position to receive a flat pack circuit module.
FIG. 10 is a similar view showing an alternative arrangement of coupling the flat pack circuit module to corresponding conductors in woven circuit arrangements in accordance with the invention.
FIG. 11 shows still another arrangement for connecting woven circuit conductors to a flat pack circuit module.

FIG. 7 is an enlarged view of one particular tube 32 floated above the associated fabric 14. FIG. 8 shows the same floated tube 32 after the cutting step which severs the tube 32 and develops a spacing between the severed ends 32*a* and 32*b*. Floated solid wires such as 34 and 36 may also be severed in similar fashion. FIG. 9 shows a plurality of tubes 32 after the cutting process to form the severed ends 32*a* and 32*b* which are bent upward from the fabric 14 in position to receive the leads of a typical circuit module of the dual-in-line type having solid terminal leads with suitable dimensions for insertion into the tubes 32*a* or 32*b*. Following the placing of the circuit modules in position with the leads thereof extending into tube ends 32*a* and 32*b*, final electrical and mechanical connection may be made by crimping the respective tubes onto the module leads inserted therein or by known dip-soldering methods.

An alternative connecting arrangement is shown in FIG. 10 for use with circuit modules having circular or partially circular terminal leads. Circuit 10 depicts a dual-in-line package 42 having such leads 44. Conductors 46 for connection to the leads 44 are shown positioned in alignment therewith. The connectors 46 may in this instance be either tubes or solid wires, generally extending in the fill direction of the woven fabric 14. In this connecting arrangement, the module 42 is moved downwardly toward the fabric 14 so that the leads 44 encompass corresponding ends of conductors 46. With the module 42 finally so positioned, the terminals 44 may be crimped with the final electrical and mechanical connection or such connection may be established with a soldering step.

FIG. 11 shows still another interconnecting arrangement. In this figure, a module 42 is shown positioned for a connection to conductors within a woven fabric 14. The upper insulating layer of the fabric 14 is partially broken away to show the arrangement of the fill conductors 56. As shown, these are fabricated by pairs of individual conductors crisscrossing back and forth in the fashion of a leno weave. In this connecting arrangement, the pins 54 of the module 42 are shaped suitably to enter within the corresponding openings of the fill conductors 56 in a manner to make contact therewith. Thereafter, the entire structure is dip soldered to complete the electrical and mechanical connection step.

Figure 12:
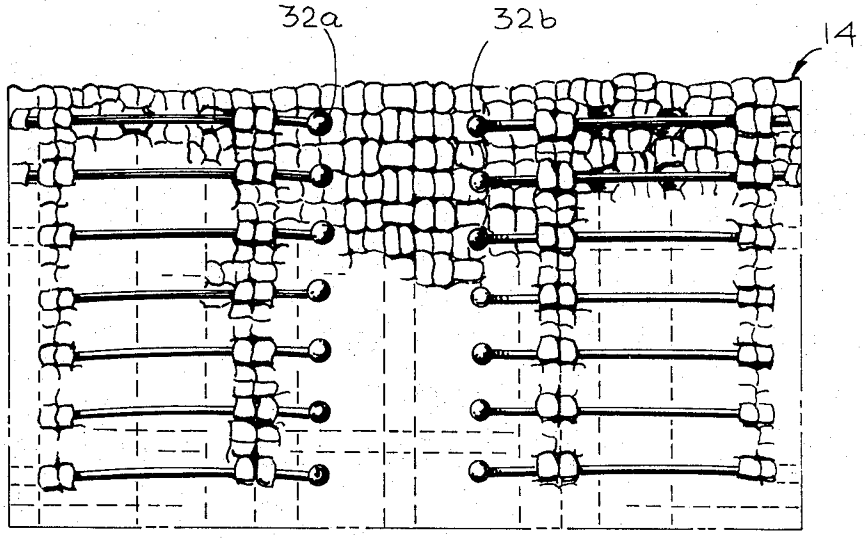
FIG. 12 is an enlarged view of a cutting area, also shown in FIG. 6, showing a number of conductors severed by burning.

FIG. 12 depicts an enlarged view of a portion of a woven circuit fabric in accordance with the invention showing the floated conductors after they have been severed. The severed ends 32*a* and 32*b* of the floated conductors of FIG. 12 have been severed by burning. This can be accomplished effectively by a high-temperature gas torch, for example, which effectively cuts through and melts back a portion of the floated wires without affecting the woven fabric 14 which itself is composed mainly of a high-temperature melting material such as glass fibers. The severed ends 32*a* and 32*b* of FIG. 12 are now ready for attachment to particular circuit module in the manner shown in FIG. 10, for example. Where the conductors to be severed comprise the tubes such as 32*a* and 32*b* of FIG. 9, the desired severance and separation are readily accomplished by the use of a grinder at sufficiently high speed and of the proper material such that the tubes are severed without filling or otherwise varying the hole within the center of the tube.

Figure 1:
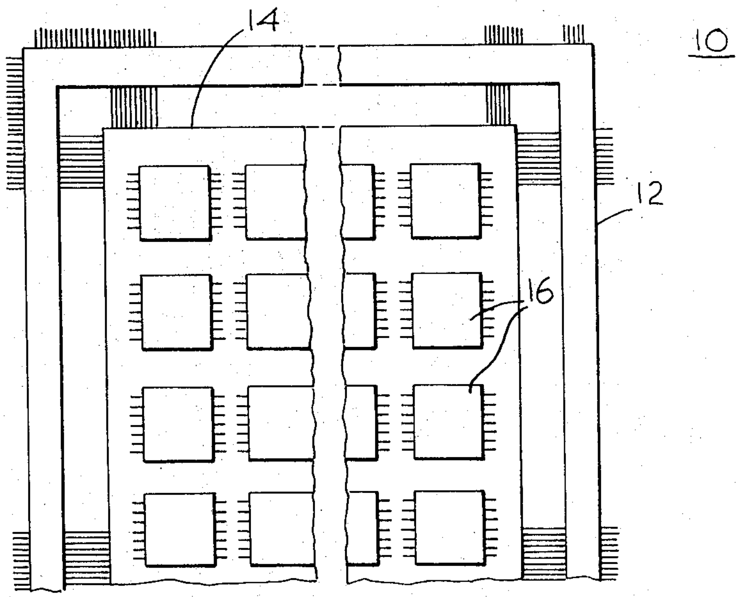
FIG. 1 is a schematic representation of one particular arrangement in accordance with the invention.
Figures 13, 14:
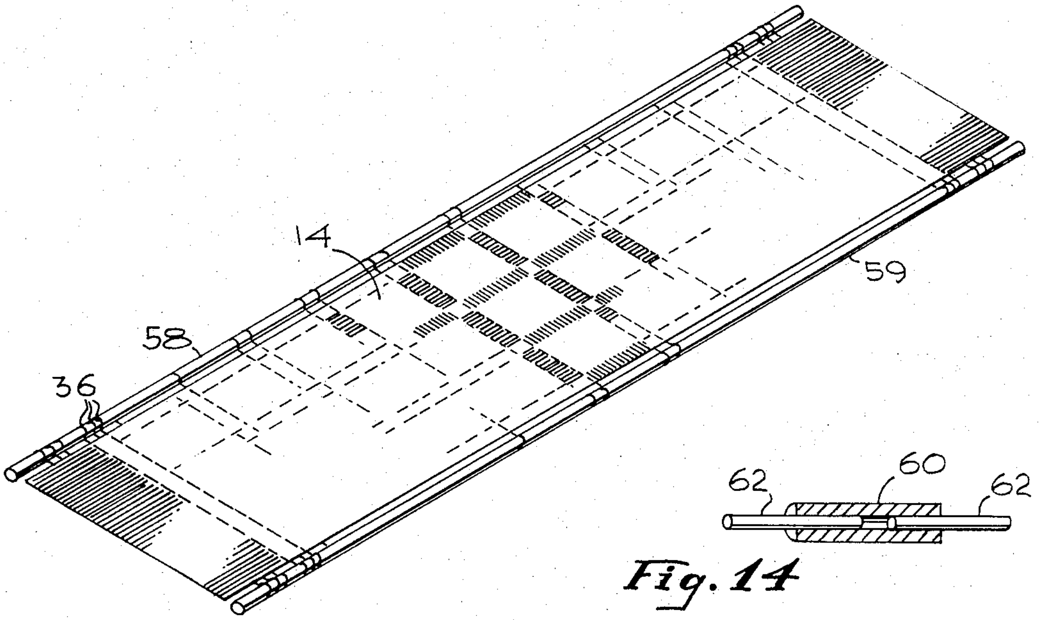
FIG. 13 is a perspective view of another particular woven circuit arrangement in accordance with the invention including B+ and ground busses.
FIG. 14 shows one particular arrangement for effecting splices of wire conductors in woven circuit arrangements of the invention.

FIG. 13 illustrates another particular arrangement in accordance with the invention similar to that shown in FIG. 1 except that the frame of the woven circuit configuration is comprised of heavy conductors which may be used as busses. In the woven circuit structure of FIG. 13, a fabric 14 is woven between a pair of heavy conductors 58 and 59. The conductors 59 may advantageously be of approximately 0.1 inch diameter copper wire as compared with the fill wires such as 36 of only a few thousands of an inch in diameter. The larger copper wires such as 58 and 59 serve to provide some rigidity and strength to the structure of the woven circuit, but also advantageously have the capacity to carry the current which is necessary to operate effectively the many circuit modules coupled into the woven circuit conductors of the fabric 14.

A typical circuit module utilizes approximately 20 milliamperes of current for normal operation. With a woven circuit structure of any substantial dimension, particularly one where the length may run to several feet, a significant current is required to be brought to and from an associated power supply in order to operate all of the various individual circuit components. This is effectively realized by a structure such as that shown in FIG. 13 in which the conductor 58 may serve as a B+ buss and the conductor 59 may be connected as the ground return or B– buss. The fill wires such as 36 are interwoven with the conductors 58 and 59 and the remainder of the woven fabric 14 by weaving back and forth in the normal manner. Thereafter, isolation between the buss conductors 58 and 59 is effected by cutting all of the fill wires at one or more points so as to eliminate the short circuit between the conductors 58 and 59.

Figure 15:
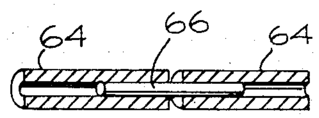
FIG. 15 shows an alternative arrangement for developing splices between woven tubes conductors in arrangements of the invention.
Figure 16:
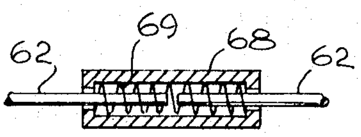
FIG. 16 illustrates still another arrangement for providing splices between woven wire conductors in arrangements with the invention.

On occasion modification of a particular woven circuit arrangement may be desired. This may occur because of a rupture of one or more of the woven conductors or it may result from a desire to modify a particular circuit arrangement. FIGS. 14, 15, and 16 show alternative arrangements for effecting splices in circuit arrangements in accordance with the invention. FIG. 14 shows a tube 60 which may be used to patch together a pair of wires 62. As is indicated, the inside diameter of the hollow tube 60 is slightly greater than the outside diameter of the wires 62. The tube 60 is slipped over one of the wires 62 and the other wire 62 is inserted from the opposite end. The circuit elements 60 and 62 may be fastened together by crimping or soldering as desired.

FIG. 15 shows a corresponding arrangement for effecting a splice between a pair of hollow conducting tubes 64. Such a splice may be effected by inserting a pin 66 within the adjacent ends of the two tubes 64, after which the tubes may be crimped to provide a good mechanical and electrical junction with the pin 66, or the connection may be completed by soldering.

FIG. 16 shows a variation of the arrangement of FIG. 14 wherein a hollow cylinder 68 is fabricated with a spring 69 contained therein. The cylinder 68 is provided with openings at its opposite ends of a dimension such as to accommodate the insertion of a pair of wires 62. The loosely coiled spring 69 and the manner of its confinement within the cylinder 68 permit ready insertion of the wires 62 but effectively grip the wires 62 and provide the desired electrical connection while preventing withdrawal of the wire 62 from the cylinder 68.

Woven circuit arrangements such as those which have been described hereinabove may be effectively fabricated on a loom with a Jacquard head. Such looms are well known, having changed very little in their structure and mode of operation in the 150 years which they have been in use. The Jacquard head is card controlled and may be programmed to develop any desired pattern for the woven circuit, thus establishing any interconnections between warp and fill conductors as desired. A typical woven circuit having a planar configuration of approximately 20 inches on a side can be woven on such a loom in approximately 4 minutes. Such a woven circuit plane can be fabricated with 0.01 inch diameter wire conductors, the wires being 0.025 inch on centers. The cost of weaving such a circuit plane is approximately $5.00 and the cost of all the materials (wires, tubes and insulated filaments) is approximately $25.00. This compares with the cost of comparable circuitry prepared by conventional techniques of approximately 20 times the cost of the woven circuit. An additional advantage is the possibility of weaving the frame to hold the woven circuit at the same time that the circuit is fabricated.

The conductors employed may be bare copper or they may be pretinned. In the latter case, the interconnections in the woven circuit and the connections from the circuit module terminals to the woven circuit tubes can be completed in one step by a dip-solder, hot fat dip, or induction heating bake in approximately 20 seconds.

In the woven matrix, the respective signal conductors may be woven in parallel for signal and return. Thus, inductance of the signal wires will be constant in terms of characteristics so that the signal lines may be treated as transmission lines.

Although various particular arrangements of a woven interconnection structure in accordance with the invention have been shown and disclosed in order to demonstrate the manner by which the invention may be employed to advantage, it will be understood that this is merely illustrative and the invention is not limited thereto. Accordingly any and all modifications, variations or equivalent arrangements which may occur to those skilled in the art should be considered to be within the scope of the invention.

What is claimed is:

1. A woven circuit configuration including a plurality of circuit modules having perpendicularly depending terminals comprising:
   - first and second pluralities of electrical conducting filaments interwoven in a fabric with a plurality of insulating fibers, the insulating fibers being situated so as to separate and insulate each filament from the rest;
   - means selectively establishing connections between selected pairs of filaments, one each from said first and second pluralities; and
   - means connecting particular ones of said filaments to respective ones of the perpendicularly depending circuit module terminals by providing a float pattern of selected filaments in the vicinity of each module having locations corresponding to the terminals thereof, each of the filaments of a float pattern having severed and bent free ends extending at a substantial angle to said fabric and aligned with the perpendicularly depending terminals of the respective associated circuit module connected thereto, each of the aligned terminals and filaments engaging the other in a mating relationship, at least some of the filaments of said first plurality comprising small hollow conducting tubes, the free ends of which receive the respective terminals of a circuit module connected thereto.

2. Apparatus in accordance with claim 1 wherein selected ones of said filaments of the first plurality are extended along a portion of said fabric without being interwoven therewith.

3. Apparatus in accordance with claim 1 further including at least a pair of conductors of substantially greater diameter than the diameter of the filaments of said first and second pluralities interwoven with filaments of one plurality along corresponding sides of the fabric so as to provide a supporting frame therefor and for carrying current to and from the woven circuit structure.

4. Apparatus in accordance with claim 1 wherein the filaments of at least one of said pluralities are woven in said fabric in multiple planar layers.

5. Apparatus in accordance with claim 4 wherein the filaments of said second plurality are selectively connected to selected filaments of different ones of said multiple planar layers.

6. A woven circuit configuration including a plurality of circuit components having perpendicularly depending leads comprising:
   - a first layer of conducting filaments interwoven with a plurality of insulating fibers in a fabric such that the conducting filaments are electrically isolated from each other;
   - at least a second layer of conducting filaments also interwoven with said insulating fibers such that said last-mentioned conducting filaments are also electrically isolated from each other, the last-mentioned filaments extending in a direction such as to cross the filaments of said first layer;
   - means including loops in selected ones of said second layer filaments establishing electrical connection with selected ones of the first layer filaments being crossed; and
   - means establishing connections between selected ones of said filaments and said circuit components including predetermined loop patterns of said selected filaments which are cut and bent and extend at a substantial angle relative to said fabric and mate with respective ones of the perpendicularly depending leads of components, the filaments mating with the component leads comprising hollow tubular members open at the ends thereof and receiving said component leads therein.

7. Apparatus in accordance with claim 6 further including a third layer of conducting filaments interwoven with the insulating fibers in said fabric so as to be electrically isolated from each other and extending generally parallel to the filaments of said first layer.

8. Apparatus in accordance with claim 7 further including means selectively establishing connections between filaments of said third and second layers at points of crossing thereof.

9. Apparatus in accordance with claim 8 wherein the first and third layers are adjacent to a surface of the fabric and the filaments of the second layer extend between the first and third layers except at the crossing points where connections are made.

10. A woven circuit configuration including a plurality of circuit components having perpendicularly depending leads comprising:
   - a first layer of conducting filaments interwoven with a plurality of insulating fibers in a fabric such that the conducting filaments are electrically isolated from each other;
   - at least a second layer of conducting filaments also interwoven with said insulating fibers such that said last-mentioned conducting filaments are also electrically isolated from each other, the last-mentioned filaments extending in a direction such as to cross the filaments of said first layer;
   - means including loops in selected ones of said second layer filaments establishing electrical connections with selected ones of the first layer filaments being crossed; and
   - means establishing connections between selected ones of said filaments and said circuit components including predetermined loop patterns of said selected filaments which are cut and bent and extend at a substantial angle relative to said fabric and mate with respective ones of the perpendicularly depending leads of said components;
   - said configuration further including means electrically and mechanically joining severed filaments comprising a member mating with the respective severed ends of the filaments, said severed filaments comprising hollow tubes and said member comprising a pin extending into the ends of a pair of tubes.

11. A woven circuit configuration including a plurality of circuit modules having depending terminals comprising:

first and second pluralities of electrical conducting filaments interwoven in a fabric with a plurality of insulating fibers, the insulating fibers being situated so as to separate and insulate each filament from the rest;

means selectively establishing connections between selected pairs of filaments, one each from said first and second pluralities; and means connecting particular ones of said filaments to respective ones of the depending circuit module terminals by providing a float pattern of selected filaments in the vicinity of each module having locations corresponding to the terminals thereof, each of the filaments of a float pattern being severed with the free ends thereof in alignment with the depending terminals of the respective associated circuit module and connected thereto, each of the aligned terminals and filaments engaging the other in a mating relationship, at least some of the filaments of said first plurality comprising small hollow conducting tubes, the free ends of which receive respective terminals of a circuit module connected thereto.

* * * * *